(12) United States Patent
Son et al.

(10) Patent No.: US 12,010,852 B2
(45) Date of Patent: Jun. 11, 2024

(54) THREE-DIMENSIONAL SEMICONDUCTOR MEMORY DEVICE

(71) Applicant: SAMSUNG ELECTRONICS CO., LTD., Suwon-si (KR)

(72) Inventors: Yoonhwan Son, Seoul (KR); Gaeun Kim, Yongin-si (KR); Jeongseok Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 374 days.

(21) Appl. No.: 17/236,053

(22) Filed: Apr. 21, 2021

(65) Prior Publication Data

US 2022/0020762 A1 Jan. 20, 2022

(30) Foreign Application Priority Data

Jul. 15, 2020 (KR) .................. 10-2020-0087460

(51) Int. Cl.
*H10B 43/40* (2023.01)
*H01L 23/535* (2006.01)
*H10B 41/27* (2023.01)
*H10B 41/41* (2023.01)
*H10B 43/27* (2023.01)

(52) U.S. Cl.
CPC ........... *H10B 43/40* (2023.02); *H01L 23/535* (2013.01); *H10B 41/27* (2023.02); *H10B 41/41* (2023.02); *H10B 43/27* (2023.02)

(58) Field of Classification Search
CPC ........ H10B 43/40; H10B 43/27; H10B 43/50; H10B 43/10; H10B 43/35; H10B 41/27; H10B 41/41; H01L 23/535
See application file for complete search history.

(56) References Cited

U.S. PATENT DOCUMENTS

| 10,504,918 | B2 | 12/2019 | Shimojo et al. | |
| 10,522,460 | B2 | 12/2019 | Ichinose et al. | |
| 10,586,805 | B2 | 3/2020 | Konno | |
| 2016/0163635 | A1* | 6/2016 | Yun | H01L 23/528 257/659 |
| 2018/0040553 | A1* | 2/2018 | Tak | H10B 41/41 |
| 2019/0139976 | A1* | 5/2019 | Lee | H10B 43/50 |
| 2019/0172838 | A1 | 6/2019 | Jo et al. | |

(Continued)

FOREIGN PATENT DOCUMENTS

KR   10-1164225 B1   7/2012

*Primary Examiner* — Alia Sabur
(74) *Attorney, Agent, or Firm* — Fish & Richardson P.C.

(57) ABSTRACT

A three-dimensional semiconductor memory device includes a peripheral circuit structure having peripheral circuits on a semiconductor substrate, and landing pads connected to the peripheral circuits, an electrode structure on the peripheral circuit structure, the electrode structure including vertically stacked electrodes, a planarized dielectric layer that covers the electrode structure, peripheral through plugs spaced apart from the electrode structure, the peripheral through plugs penetrating the planarized dielectric layer to connect to the landing pads, conductive lines connected through contact plugs, respectively, to the peripheral through plugs, and at least one dummy through plug adjacent to a first peripheral through plug of the peripheral through plugs, the at least one dummy through plug penetrating the planarized dielectric layer and being insulated from the conductive lines.

18 Claims, 12 Drawing Sheets

(56) References Cited

U.S. PATENT DOCUMENTS

| | | | |
|---|---|---|---|
| 2019/0287894 A1 | 9/2019 | Nakajima et al. | |
| 2019/0287985 A1* | 9/2019 | Shimojo | H10B 43/35 |
| 2019/0319042 A1 | 10/2019 | Baek et al. | |
| 2020/0006270 A1* | 1/2020 | Lee | H10B 41/27 |
| 2020/0043830 A1 | 2/2020 | Baek | |
| 2020/0058671 A1 | 2/2020 | Kim et al. | |
| 2020/0105786 A1* | 4/2020 | Park | H10B 43/35 |
| 2020/0126622 A1* | 4/2020 | Utsumi | H10B 43/40 |
| 2021/0391257 A1* | 12/2021 | Nguyen | H10B 43/50 |

* cited by examiner

THREE-DIMENSIONAL SEMICONDUCTOR MEMORY DEVICE

CROSS-REFERENCE TO RELATED APPLICATION

Korean Patent Application No. 10-2020-0087460, filed on Jul. 15, 2020, in the Korean Intellectual Property Office, and entitled: "Three-Dimensional Semiconductor Memory Device," is incorporated by reference herein in its entirety.

BACKGROUND

1. Field

The present disclosure relates to a three-dimensional semiconductor memory device, and more particularly, to a three-dimensional semiconductor memory device with improved reliability and increased integration.

2. Description of the Related Art

Semiconductor devices have been highly integrated to meet high performance and low manufacturing cost which are required by customers. Because integration of the semiconductor devices is an important factor in determining product price, high integration is increasingly requested. Integration of typical two-dimensional or planar semiconductor devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

According to some example embodiments, a three-dimensional semiconductor memory device may include a peripheral circuit structure that includes a plurality of peripheral circuits integrated on a semiconductor substrate and a plurality of landing pads connected to the peripheral circuits, an electrode structure on the peripheral circuit structure, the electrode structure including a plurality of vertically stacked electrodes, a planarized dielectric layer that covers the electrode structure, a plurality of peripheral through plugs spaced apart from the electrode structure and connected to the landing pads, the peripheral through plugs penetrating the planarized dielectric layer, a plurality of conductive lines correspondingly connected through a plurality of contact plugs to the peripheral through plugs, and a dummy through plug that is disposed around a first peripheral through plug of the peripheral through plugs and penetrates the planarized dielectric layer, the dummy through plug being insulated from the conductive lines.

According to some example embodiments, a three-dimensional semiconductor memory device may include a peripheral circuit structure that includes a plurality of peripheral circuits integrated on a semiconductor substrate and a plurality of landing pads connected to the peripheral circuits, a horizontal layer that includes a cell array region, a first connection region, and a second connection region, an electrode structure on the cell array region and the first connection region, the electrode structure including a plurality of electrodes vertically stacked on the horizontal layer, and the electrode structure having a stepwise structure on the first connection region, a planarized dielectric layer that covers the electrode structure, a plurality of peripheral through plugs on the second connection region and connected to the landing pads, the peripheral through plugs penetrating the planarized dielectric layer. The peripheral though plugs may include a first peripheral through plug, a second peripheral through plug spaced apart at a first distance from the first peripheral through plug, a third peripheral through plug spaced apart at a second distance from the second peripheral through plug, the second distance being less than the first distance, and a dummy through plug around the first peripheral through plug, the dummy through plug penetrating the planarized dielectric layer. Each of the first, second, and third peripheral through plugs may have a first upper width. The dummy through plug may have a second upper width less than the first upper width.

According to some example embodiments, a three-dimensional semiconductor memory device may include a peripheral circuit structure that includes a plurality of peripheral circuits integrated on a semiconductor substrate and a plurality of landing pads connected to the peripheral circuits, a horizontal layer that includes a cell array region, a first connection region, and a second connection region, an electrode structure on the cell array region and the first connection region, the electrode structure including a plurality of electrodes vertically stacked on the horizontal layer, and the electrode structure having a stepwise structure on the first connection region, a planarized dielectric layer that covers the electrode structure, a plurality of vertical channel structures on the cell array region, the vertical channel structures penetrating the electrode structure, a cell through plug on the first connection region and coupled to a first landing pad of the landing pads, the cell through plug penetrating the electrode structure, a first peripheral through plug on the second connection region and coupled to a second landing pad of the landing pads, a second peripheral through plug spaced apart at a first distance from the first peripheral through plug, a third peripheral through plug spaced apart at a second distance from the second peripheral through plug, the second distance being less than the first distance, a dummy through plug around the first peripheral through plug, the dummy through plug penetrating the planarized dielectric layer, and a plurality of conductive lines on an interlayer dielectric layer on the planarized dielectric layer and correspondingly connected through a plurality of contact plugs to the first, second, and third peripheral through plugs. Each of the first, second, and third peripheral through plugs may have a first upper width. The dummy through plug may have a second upper width less than the first upper width.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
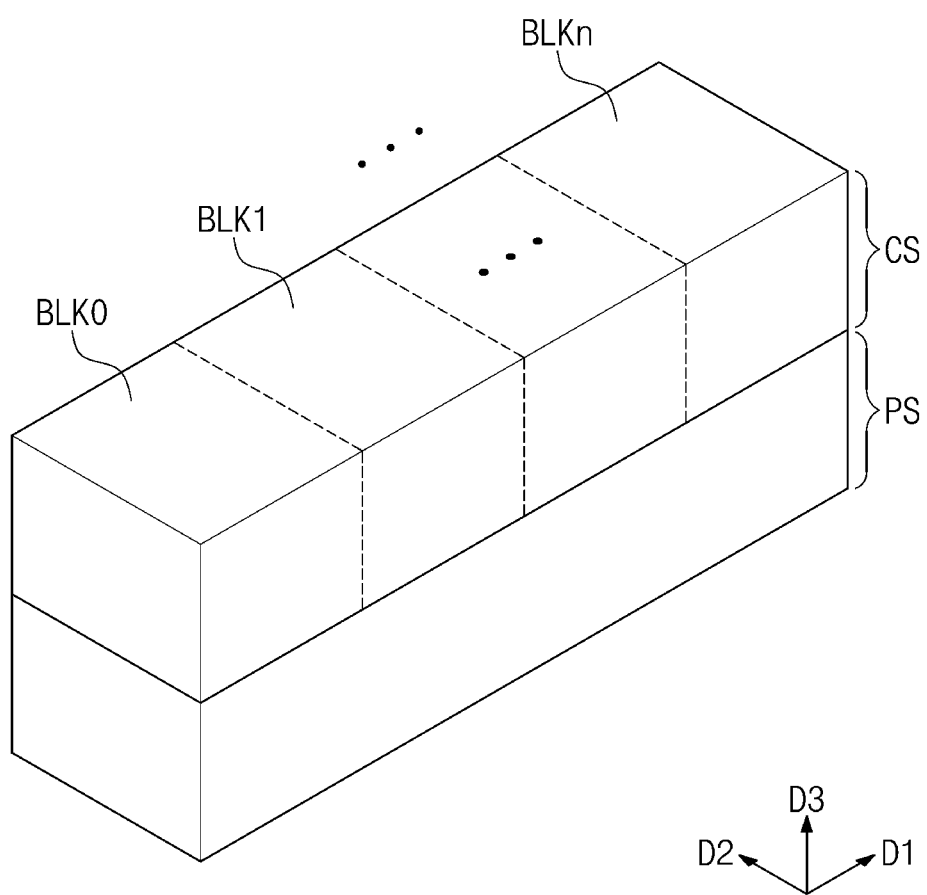
FIG. 1 illustrates a simplified perspective view of a three-dimensional semiconductor memory device according to some example embodiments.

FIG. 1 illustrates a simplified perspective view of a three-dimensional semiconductor memory device according to some example embodiments.

Referring to FIG. 1, a three-dimensional semiconductor memory device according to some example embodiments may include a peripheral circuit structure PS, a cell array structure CS on the peripheral circuit structure PS, and a wiring structure that connects the cell array structure CS to the peripheral circuit structure PS. The peripheral circuit structure PS may include, e.g., row and column decoders, a page buffer, and control circuits. When viewed in a plan view, the cell array structure CS may overlap the peripheral circuit structure PS. The cell array structure CS may include a plurality of memory blocks BLK1 to BLKn, each of which is a data erasure unit. Each of the memory blocks BLK0 to BLKn may include a memory cell array having a three-dimensional structure (i.e., a vertical structure).

Figure 2:
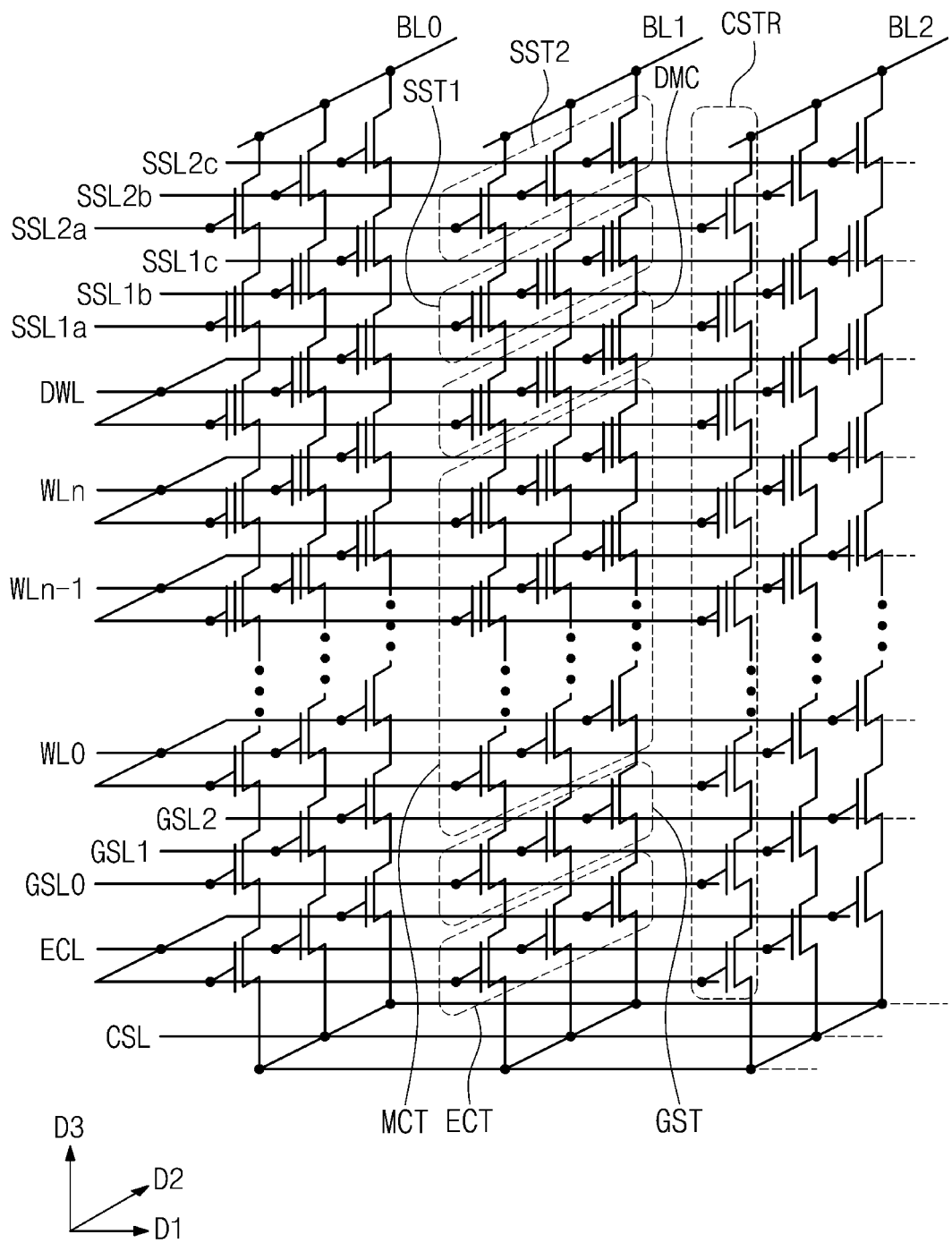
FIG. 2 illustrates a circuit diagram of a cell array of a three-dimensional semiconductor memory device according to some example embodiments.

FIG. 2 illustrates a circuit diagram of the cell array structure CS of FIG. 1. Referring to FIG. 2, cell strings CSTR may be two-dimensionally arranged along first and second directions D1 and D2, and may extend along a third direction D3. A plurality of the cell strings CSTR may be connected in parallel to each of bit lines BL0 to BL2. The plurality of cell strings CSTR may be connected in common to a common source line CSL.

Each of the cell strings CSTR may include string selection transistors SST1 and SST2 connected in series, memory cell transistors MCT connected in series, a ground selection transistor GST, and an erase control transistor ECT. Each of the memory cell transistors MCT may include a data storage element. Each of the cell strings CSTR may further include dummy cells DMC connected between a first string selection transistor SST1 and the memory cell transistor MCT, and between the ground selection transistor GST and the memory cell transistor MCT.

The first string selection transistor SST1 may be controlled by one of first string selection lines SSL1$a$, SSL1$b$, and SSL1$c$, and the second string selection transistor SST2 may be controlled by one of second string selection lines SSL2$a$, SSL2$b$, and SSL2$c$. The memory cell transistors MCT may be controlled by corresponding word lines WL0 to WLn, and the dummy cells DMC may be controlled by corresponding dummy word lines DWL. The ground selection transistor GST may be controlled by a ground selection line GSL0, GSL1, or GSL2, and the erase control transistor ECT may be controlled by an erase control line ECL.

Figure 3:
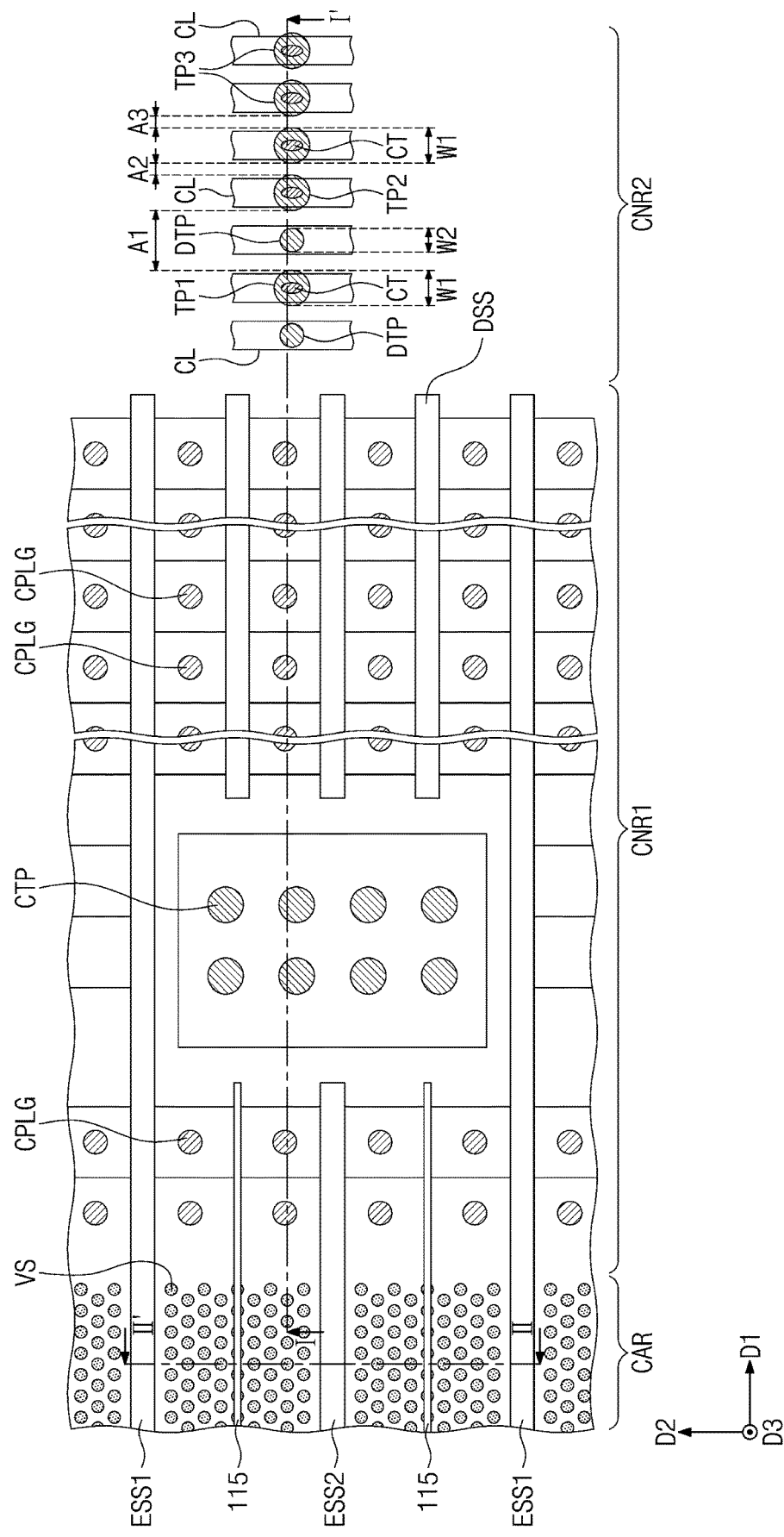
FIG. 3 illustrates a plan view of a three-dimensional semiconductor memory device according to some example embodiments.
Figure 4A:
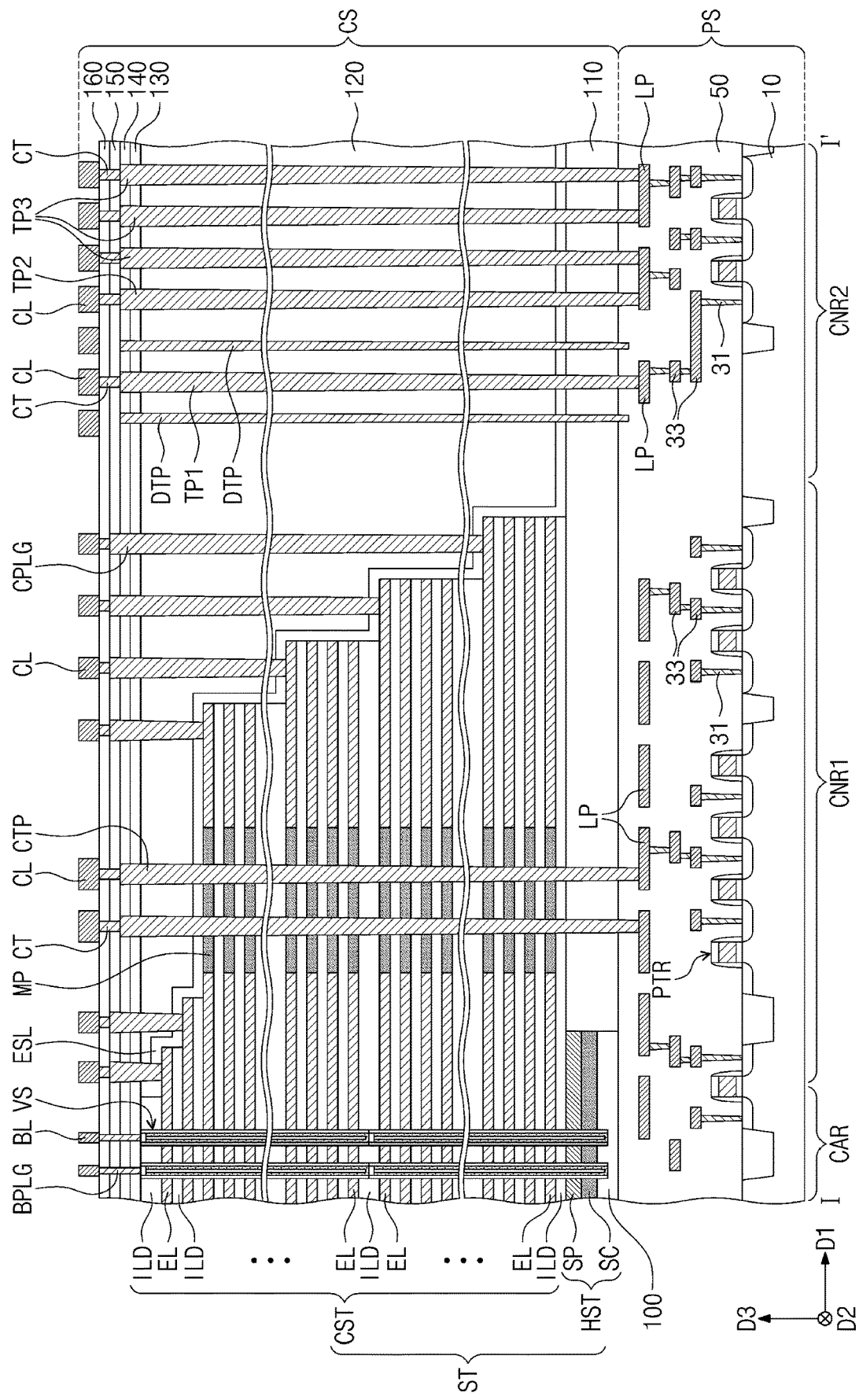
FIG. 4A illustrates a cross-sectional view along line I-I' of FIG. 3.

FIG. 3 illustrates a plan view of a three-dimensional semiconductor memory device according to some example embodiments. FIG. 4A illustrates a cross-sectional view taken along line I-I' of FIG. 3, FIG. 4B illustrates a cross-sectional view taken along line II-II' of FIG. 3, and FIG. 5 illustrates an enlarged view showing section A of FIG. 4B.

Figure 4B:
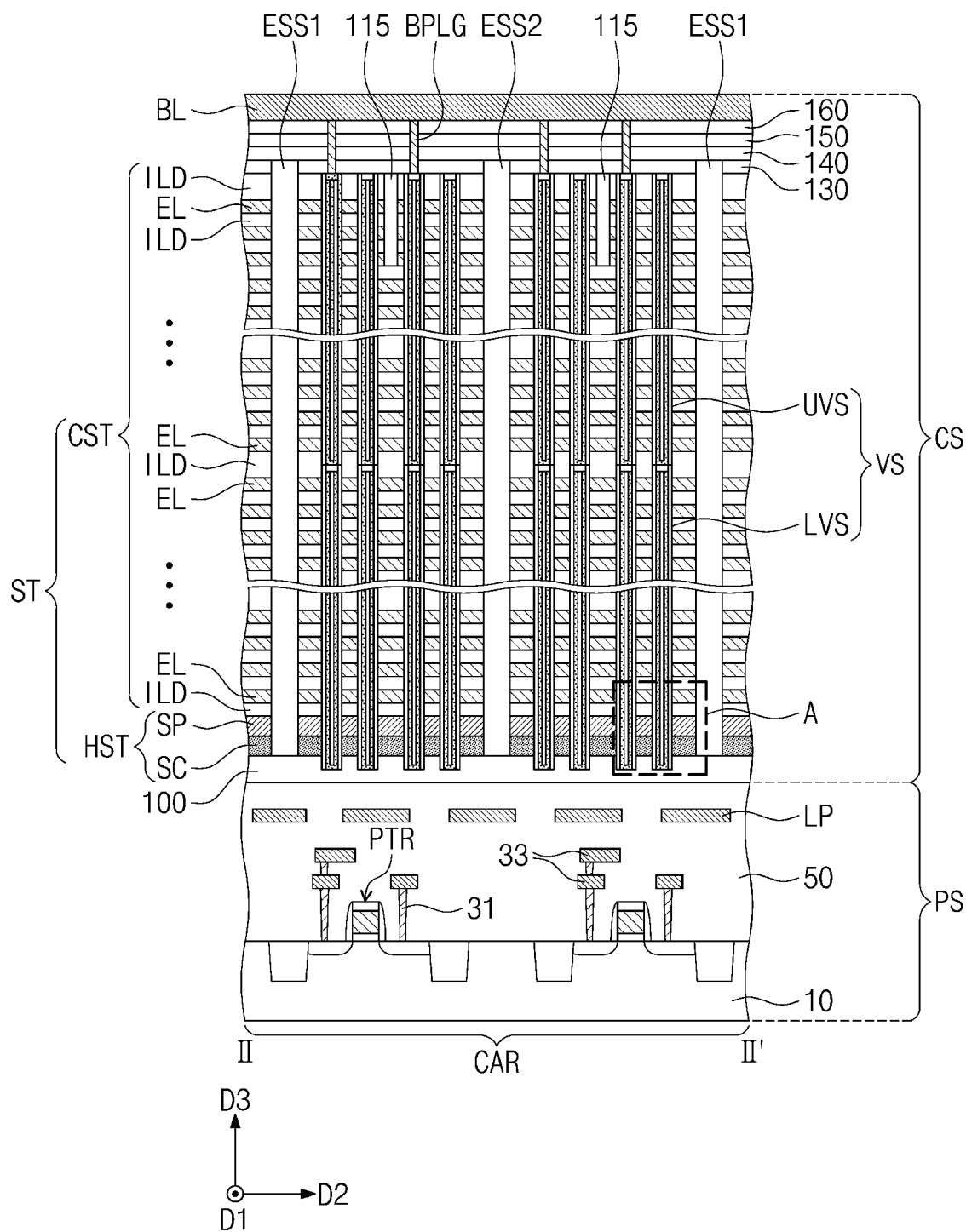
FIG. 4B illustrates a cross-sectional view along line II-IF of FIG. 3.
Figure 5:
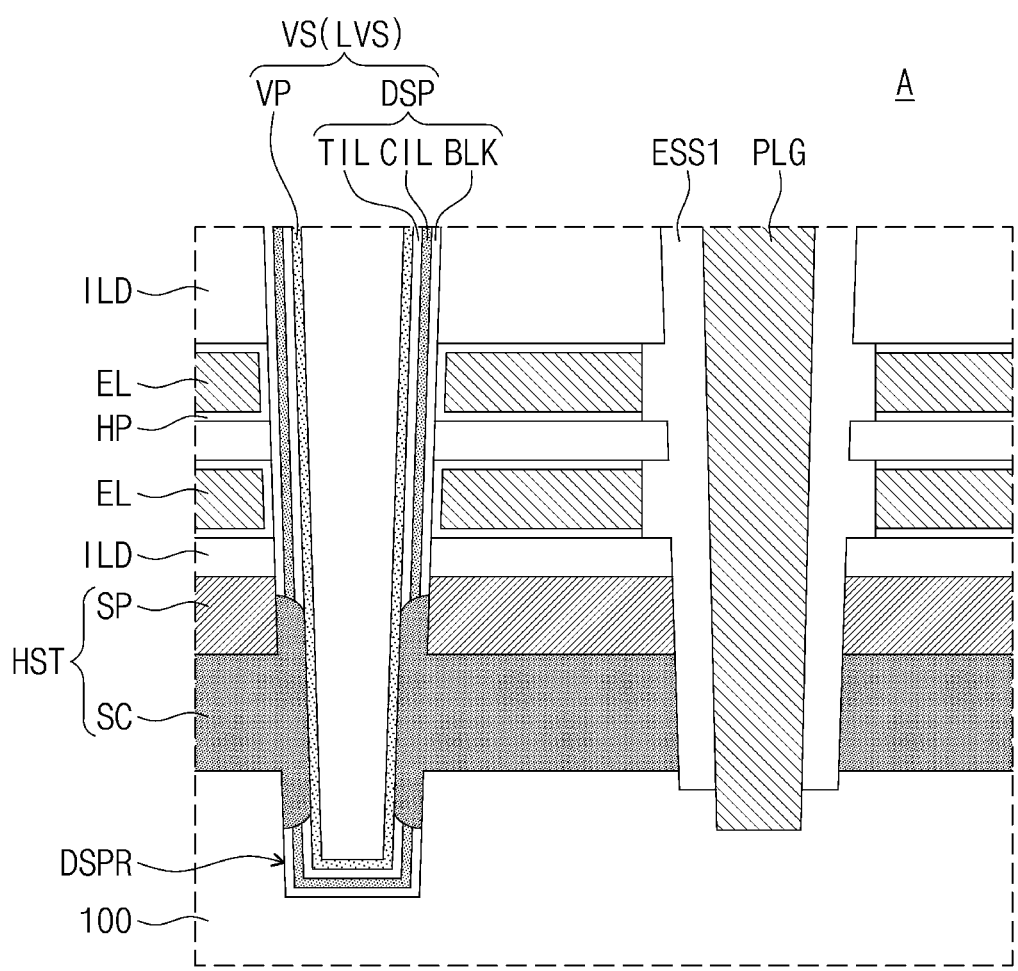
FIG. 5 illustrates an enlarged view of section A of FIG. 4B.

Referring to FIGS. 3, 4A, and 4B, as discussed previously with reference to FIG. 1, a three-dimensional semiconductor memory device according to some example embodiments may include the peripheral circuit structure PS and the cell array structure CS on the peripheral circuit structure PS.

The peripheral circuit structure PS may include peripheral logic circuits PTR that are integrated on an entire surface of a semiconductor substrate 10, and also include a lower buried dielectric layer 50 that covers the peripheral logic circuits PTR. The semiconductor substrate 10 may be, e.g., a silicon substrate. The peripheral logic circuits PTR may be row and column decoders, a page buffer, a control circuit, and the like. For example, the peripheral logic circuits PTR may include NMOS and PMOS transistors. Peripheral circuit lines 33 may be electrically connected through peripheral contact plugs 31 to the peripheral logic circuits PTR.

The lower buried dielectric layer 50 may be provided on the entire surface of the semiconductor substrate 10. On the semiconductor substrate 10, the lower buried dielectric layer 50 may cover the peripheral logic circuits PTR, the peripheral contact plugs 31, the peripheral circuit lines 33, and landing pads LP. The lower buried dielectric layer 50 may include a plurality of stacked dielectric layers. The peripheral contact plugs 31, the peripheral circuit lines 33, and the landing pads LP may be electrically connected to the peripheral logic circuits PTR.

The cell array structure CS may include a horizontal layer 100, an electrode structure ST, vertical channel structures VS, and through line plugs.

The horizontal layer 100 may include a cell array region CAR, a first connection region CNR1, and a second connection region CNR2. The horizontal layer 100 may be disposed on a top surface of the lower buried dielectric layer 50. The horizontal layer 100 may be formed of, e.g., a semiconductor material, a dielectric material, or a conductive material. The horizontal layer 100 may include a semiconductor doped with impurities having a first conductivity type (e.g., n-type) and/or an intrinsic semiconductor doped with no impurities.

The electrode structure ST may include a horizontal structure HST on the horizontal layer 100 and a cell electrode structure CST on the horizontal structure HST.

The horizontal structure HST may include a source conductive pattern SC and a support conductive pattern SP on the source conductive pattern SC. A dielectric layer may be interposed between the source conductive pattern SC and the support conductive pattern SP. The horizontal structure HST may be parallel to a top surface of the horizontal layer 100, and on the cell array region CAR, may extend in a first direction D1 parallel to the cell electrode structure CST.

The source conductive pattern SC may be formed of a semiconductor material doped with first conductivity type impurities (e.g., phosphorus (P) or arsenic (As)). For example, the source conductive pattern SC may be formed of a semiconductor layer doped with n-type impurities. The support conductive pattern SP may cover a top surface of the source conductive pattern SC, and may include a semiconductor doped with impurities having a first conductivity type (e.g., n-type) and/or an intrinsic semiconductor doped with no impurities.

A buried dielectric layer 110 may be disposed on the horizontal layer 100 on the first connection region CNR1, covering a sidewall of the horizontal structure HST. The buried dielectric layer 110 may have a top surface substantially coplanar with that of the horizontal structure HST.

The cell electrode structure CST may be disposed on the horizontal structure HST and the buried dielectric layer 110. The cell electrode structure CST may be disposed from the cell array region CAR to the first connection region CNR1, and may have a stepwise structure on the first connection region CNR1.

The cell electrode structure CST may include electrodes EL and dielectric layers ILD that are alternately stacked along the third direction D3, i.e., along a vertical direction, perpendicular to the first and second directions D1 and D2. The electrodes EL may include, e.g., at least one of doped semiconductors (e.g., doped silicon), metals (e.g., tungsten, copper, or aluminum), conductive metal nitrides (e.g., titanium nitride, tantalum, or nitride), and transition metals (e.g., titanium or tantalum). The dielectric layers ILD may include one or more of, e.g., a silicon oxide layer and a low-k dielectric layer. According to some example embodiments, a three-dimensional semiconductor memory device may be a vertical NAND Flash memory device, and in this case, the electrodes EL of the electrode structure ST may be used as the erase control line ECL, the ground selection lines GSL0 to GSL2, the word lines WL0 to WLn and DWL, and the string selection lines SSL1a to SSL1c and SSL2a to SSL2c that are discussed with reference to FIG. 2.

Each of the electrodes EL may have a pad portion on the first connection region CNR1. Dummy separation structures DSS may separate the pad portions of the electrodes EL from each other in the second direction D2.

For example, the pad portions of $4n^{th}$ electrodes EL in the cell electrode structures CST may be disposed along the first direction D1 (where, n is a positive integer). In this case, $(4n-1)^{th}$, $(4n-2)^{th}$, and $(4n-3)^{th}$ electrodes EL may have their sidewalls aligned with that of the $4n^{th}$ electrode EL. Cell contact plugs CPLG may be coupled to the pad portions of the $4n^{th}$ electrodes EL.

In another example, the pad portions of even-numbered or odd-numbered electrodes EL in the cell electrode structure CST may be disposed along the first direction D1, and the cell contact plugs CPLG may be coupled to corresponding pad portions of the even-numbered electrodes EL. In yet another example, the pad portions of the electrodes EL may be horizontally and vertically positioned at different locations.

According to some example embodiments, on the first connection region CNR1, the cell electrode structure CST may include mold patterns MP that are positioned at the same levels as those of the electrodes EL and are disposed between the dielectric layers ILD. The mold patterns MP may be closer than the pad portions of the electrodes EL to the cell array region CAR.

The horizontal layer 100 may be provided thereon with first and second electrode separation structures ESS1 and ESS2 that penetrate the electrode structure ST. The first electrode separation structures ESS1 may extend along the first direction D1 from the cell array region CAR toward the first connection region CNR1, and may be spaced apart from each other in the second direction D2 that intersects the first direction D1. The second electrode separation structure ESS2 may penetrate the electrode structure ST on the cell array region CAR. The second electrode separation structure ESS2 may be disposed between the first electrode separation structures ESS1. The second electrode separation structure ESS2 may have a length in the first direction D1 less than that of the first electrode separation structure ESS1. Alternatively, a plurality of second electrode separation structures ESS2 may be provided between the first electrode separation structures ESS1. Each of the first and second electrode separation structures ESS1 and ESS2 may include a dielectric layer that covers a sidewall of the electrode structure ST.

The first connection region CNR1 may be provided thereon with dummy separation structures DSS that are spaced apart from the first and second electrode separation structures ESS1 and ESS2 and penetrate a planarized dielectric layer 120 and the electrode structure ST. The dummy separation structures DSS may extend along the first direction D1.

A separation dielectric pattern 115 may penetrate two or three electrodes EL positioned at the top of the cell electrode structure CST. The separation dielectric pattern 115 may have a linear shape that extends in the first direction D1, and the electrodes EL adjacent to the separation dielectric pattern 115 may be spaced apart from each other in the second direction D2.

An etch stop layer ESL may be interposed between the planarized dielectric layer 120 and the electrode structures ST, and may have a substantially uniform thickness. For example, the etch stop layer ESL may conformally cover a surface of the stepwise structure of the electrode structure ST. In this case, the etch stop layer ESL may cover the pad portions of the electrodes EL on the first connection region CNR1. The etch stop layer ESL may include a material having an etch selectivity with respect to the planarized dielectric layer 120, the dielectric layers ILD, and the electrodes EL of the electrode structure ST.

The planarized dielectric layer 120 may cover the stepwise pad portions of the electrode structures ST. The planarized dielectric layer 120 may have a substantially flat top surface. The planarized dielectric layer 120 may include a single dielectric layer or a plurality of stacked dielectric layers. First, second, third, and fourth interlayer dielectric layers 130, 140, 150, and 160 may be sequentially stacked on the planarized dielectric layer 120.

A plurality of vertical channel structures VS may penetrate the electrode structure ST on the cell array region CAR. Each of the vertical channel structures VS may include a lower vertical structure LVS that penetrates a lower portion of the electrode structure ST and an upper vertical structure UVS that penetrates an upper portion of the electrode structure ST. Each of the lower and upper vertical structures LVS and UVS may have a width, e.g., a diameter, that increases as approaching an upper portion from a lower portion thereof.

Referring to FIG. 5, each of the lower and upper vertical structures LVS and UVS may include a vertical semiconductor pattern VP and a data storage pattern DSP that surrounds a sidewall of the vertical semiconductor pattern VP. For example, the vertical semiconductor pattern VP may have a macaroni shape or a pipe shape whose bottom end is closed. The vertical semiconductor pattern VP may be shaped like U, and may have an inside filled with a dielectric material. The vertical semiconductor pattern VP may include a semiconductor material, e.g., silicon (Si), germanium (Ge), or a mixture thereof. The vertical semiconductor pattern VP including a semiconductor material may be used as channels of the erase control transistor ECT, the string and ground selection transistors SST and GST, and the memory cell transistors MCT discussed with reference to FIG. 2.

The data storage pattern DSP may extend in the third direction D3 and may surround the sidewall of each vertical semiconductor pattern VP. The data storage pattern DSP may have a macaroni shape or a pipe shape whose top and bottom ends are open. The data storage pattern DSP may be formed of a single thin layer or a plurality of thin layers. In some example embodiments, the data storage pattern DSP may include a tunnel dielectric layer TIL, a charge storage layer CIL, and a blocking dielectric layer BLK that are sequentially stacked on the sidewall of the vertical semiconductor pattern VP, which layers TIL, CIL, and BLK constitute a data storage layer of a NAND Flash memory device. For example, the charge storage layer CIL may be a trap dielectric layer, a floating gate electrode, or a dielectric layer including conductive nano-dots. Additionally, the horizontal layer 100 may include therein a dummy data storage pattern DSPR vertically spaced apart from the data storage pattern DSP. The dummy data storage pattern DSPR may have a thin-layered structure the same as that of the data storage pattern DSP.

A horizontal dielectric pattern HP may be provided between the data storage pattern DSP and sidewalls of the electrodes EL. The horizontal dielectric pattern HP may extend from the sidewalls of the electrodes EL onto top and bottom surfaces of the electrodes EL.

Referring back to FIG. 5, the vertical semiconductor pattern VP of each lower vertical structure LVS may have a sidewall whose portion contacts the source conductive pattern SC. The data storage pattern DSP of each lower vertical structure LVS may have a bottom surface at a level that is lower than that of a bottom surface of a lowermost electrode EL and higher than that of the top surface of the source conductive pattern SC. A conductive plug PLG may be provided in the electrode separation structures ESS1 and ESS2 and in contact with the horizontal layer 100.

Although bit lines are omitted in plan views, referring to FIGS. 4A and 4B, bit lines BL may be disposed on the fourth interlayer dielectric layer 160 on the cell array region CAR, and the bit lines BL may extend in the second direction D2 while extending across the electrode structure ST. The bit lines BL may be electrically connected through bit-line contact plugs BPLG to the vertical channel structures VS.

On the first connection region CNR1, cell through plugs CTP may vertically penetrate the electrode structure ST and the horizontal layer 100. The cell through plugs CTP may penetrate the mold patterns MP of the cell electrode structure CST and may have connection with the landing pads LP of the peripheral circuit structure PS. The cell through plugs CTP may be electrically connected to the cell contact plugs CPLG through conductive lines CL. The cell through plugs CTP may be formed simultaneously with peripheral through plugs TP1, TP2, and TP3 on the second connection region CNR2.

On the second connection region CNR2, the peripheral through plugs TP1, TP2, and TP3 may penetrate the planarized dielectric layer 120 and may be coupled to the landing pads LP of the peripheral circuit structure PS. The peripheral through plugs TP1, TP2, and TP3 may be spaced apart from the horizontal layer 100 and the electrode structure ST, e.g., in the first direction D1. In some example embodiments, the peripheral through plugs TP1, TP2, and TP3 may include first, second, and third peripheral through plugs TP1, TP2, and TP3. For example, as illustrated in FIG. 3, the first peripheral through plug TP1 may be a most adjacent peripheral through plug to the first connection region CNR1 of the peripheral through plugs TP1 through TP3, e.g., the peripheral through plugs TP1, TP2, and TP3 may be aligned along the first direction D1 from the first peripheral through plug TP1.

The first peripheral through plug TP1 may be disposed spaced apart at a first distance A1 from the second peripheral through plug TP2. Neighboring second and third peripheral through plugs TP2 and TP3 may be disposed spaced apart at a second distance A2 from each other. The second distance A2 may be less than the first distance A1. The third peripheral through plugs TP3 may be disposed spaced apart at a third distance A3 from each other. The third distance A3 may be substantially the same as the second distance A2. Each of the first, second, and third peripheral through plugs TP1, TP2, and TP3 may have a first upper width W1. The first upper width W1 may correspond to a diameter at a top surface of each of the first, second, and third peripheral through plugs TP1, TP2, and TP3.

Dummy through plugs DTP may be disposed around the first peripheral through plug TP1, e.g., dummy through plugs DTP may be formed to surround disposed around the first peripheral through plug TP1.

For example, the dummy through plugs DTP may be disposed at one side or at opposite sides of the first peripheral through plug TP1, e.g., the first peripheral through plug TP1 may be between two dummy through plugs DTP along the first direction D1. For example, the dummy through plugs DTP may be patterns that are not applied with an electrical signal or do not perform an electrically specific function.

Each of the dummy through plugs DTP may have a second upper width W2 less than the first upper width W1 of the first through third peripheral through plugs TP1, TP2, and TP3. The second upper width W2 may correspond to a diameter at a top surface of the dummy through plug DTP. The dummy through plugs DTP may each have a vertical length in the third direction D3 less than that of each of the peripheral through plugs TP1, TP2, and TP3.

The dummy through plugs DTP may contact the lower buried dielectric layer 50 of the peripheral circuit structure PS. Alternatively, the dummy through plugs DTP may contact the planarized dielectric layer 120 or the buried dielectric layer 110 of the cell array structure CS.

None of the landing pads LP, the peripheral logic circuits PTR, and the peripheral circuit lines 33 may be disposed below, e.g., directly underneath, the dummy through plugs DTP. For example, when viewed in a plan view, bottoms of the dummy through plugs DTP may not overlap tops of the landing pads LP, the peripheral logic circuits PTR, or the peripheral circuit lines 33, e.g., the bottoms of the dummy through plugs DTP may be horizontally spaced apart from the tops of the landing pads LP, the peripheral logic circuits PTR, or the peripheral circuit lines 33.

The dummy through plugs DTP may be vertically and horizontally spaced apart from the landing pads LP, e.g., the dummy through plugs DTP may be diagonally spaced apart from the landing pads LP in an upward direction. For example, the dummy through plugs DTP may have their bottom surfaces at a higher level than that of top surfaces of the landing pads LP, while being horizontally spaced apart from the landing pads LP, the peripheral logic circuits PTR, or the peripheral circuit lines 33. The dummy through plugs DTP may have their top surfaces at substantially the same level as that of top surface of the first, second, and third peripheral through plugs TP1, TP2, and TP3. The top surfaces of the dummy through plugs DTP may directly contact the third interlayer dielectric layer 150, and may be electrically separated or insulated from the conductive lines CL.

The dummy through plugs DTP may be formed simultaneously with the first, second, and third peripheral through plugs TP1, TP2, and TP3, and it may be possible to reduce process errors when the first peripheral through plug TP1 is formed. For example, when the first peripheral through plug TP1 is formed with the dummy through plugs DTP around it, a through hole exposing the landing pad LP may be easily formed for the first peripheral through plug TP1, e.g., a through hole exposing the landing pad LP may be easily identified among the holes made for the first peripheral through plug TP1 and the dummy through plugs DTP.

The conductive lines CL may be disposed on the fourth interlayer dielectric layer 160 on the second connection region CNR2, and may be coupled through contact plugs CT to corresponding ones of the first, second, and third peripheral through plugs TP1, TP2, and TP3. Ones of the conductive lines CL may overlap the dummy through plugs DTP on the second connection region CNR2.

The cell contact plugs CPLG may penetrate the first, second, and third interlayer dielectric layers 130, 140, and 150 and the planarized dielectric layer 120, and may be coupled to corresponding pad portions of the electrodes EL. The cell contact plugs CPLG may have their vertical lengths that decrease as approaching the cell array region CAR. The cell contact plugs CPLG may have their top surfaces substantially coplanar with each other. The conductive lines CL may be disposed on the fourth interlayer dielectric layer 160 on the first connection region CNR1, and may be coupled through the contact plugs CT to the cell contact plugs CPLG.

The following will describe three-dimensional semiconductor memory devices according to some example embodiments with reference to FIGS. 6 to 11, and for brevity of description, omission will be made to avoid repetitive explanations of the same technical features of the three-dimensional semiconductor memory device discussed above, and differences thereof will be discussed.

Figure 6:
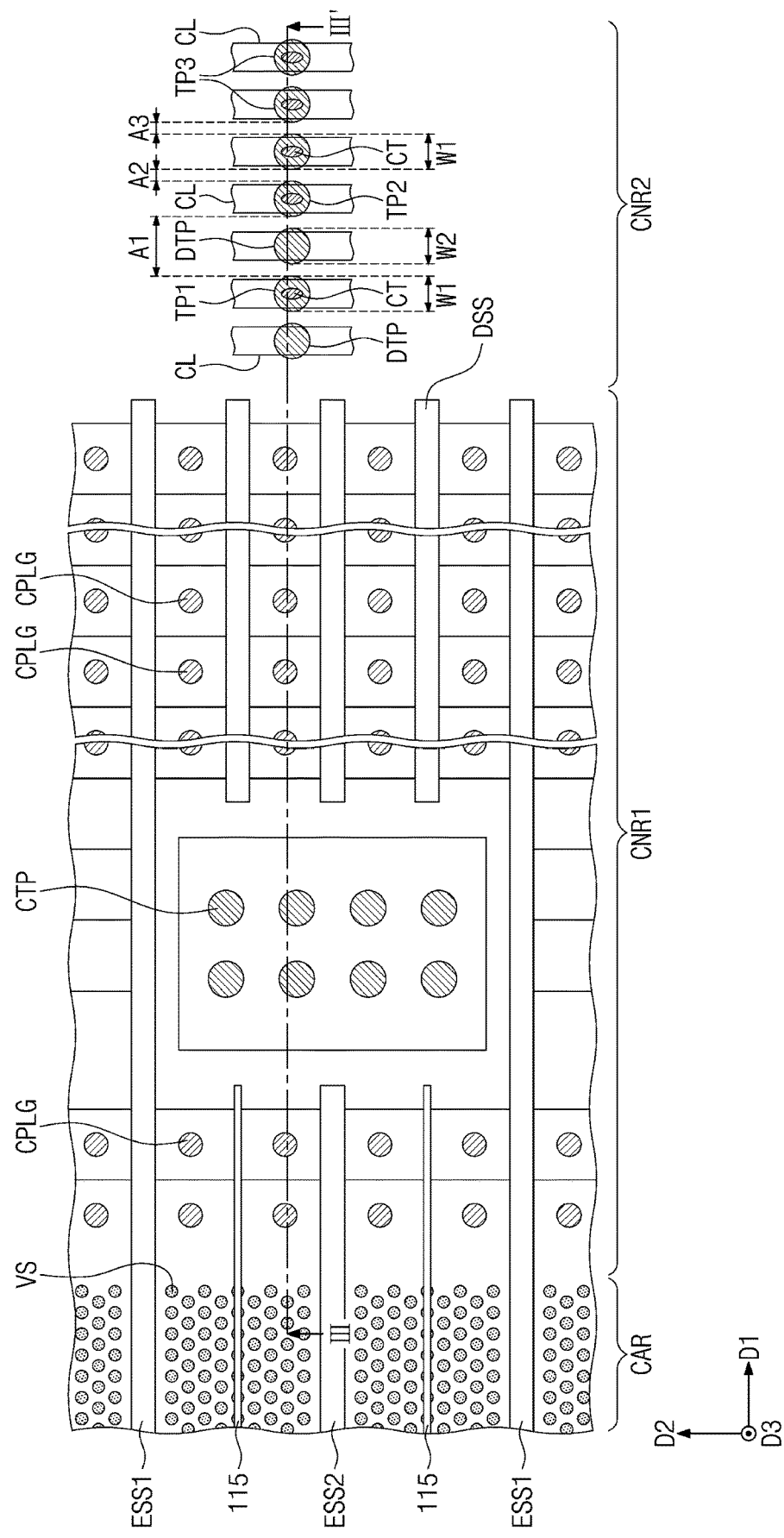
FIG. 6 illustrates a plan view of a three-dimensional semiconductor memory device according to some example embodiments.
Figure 7:
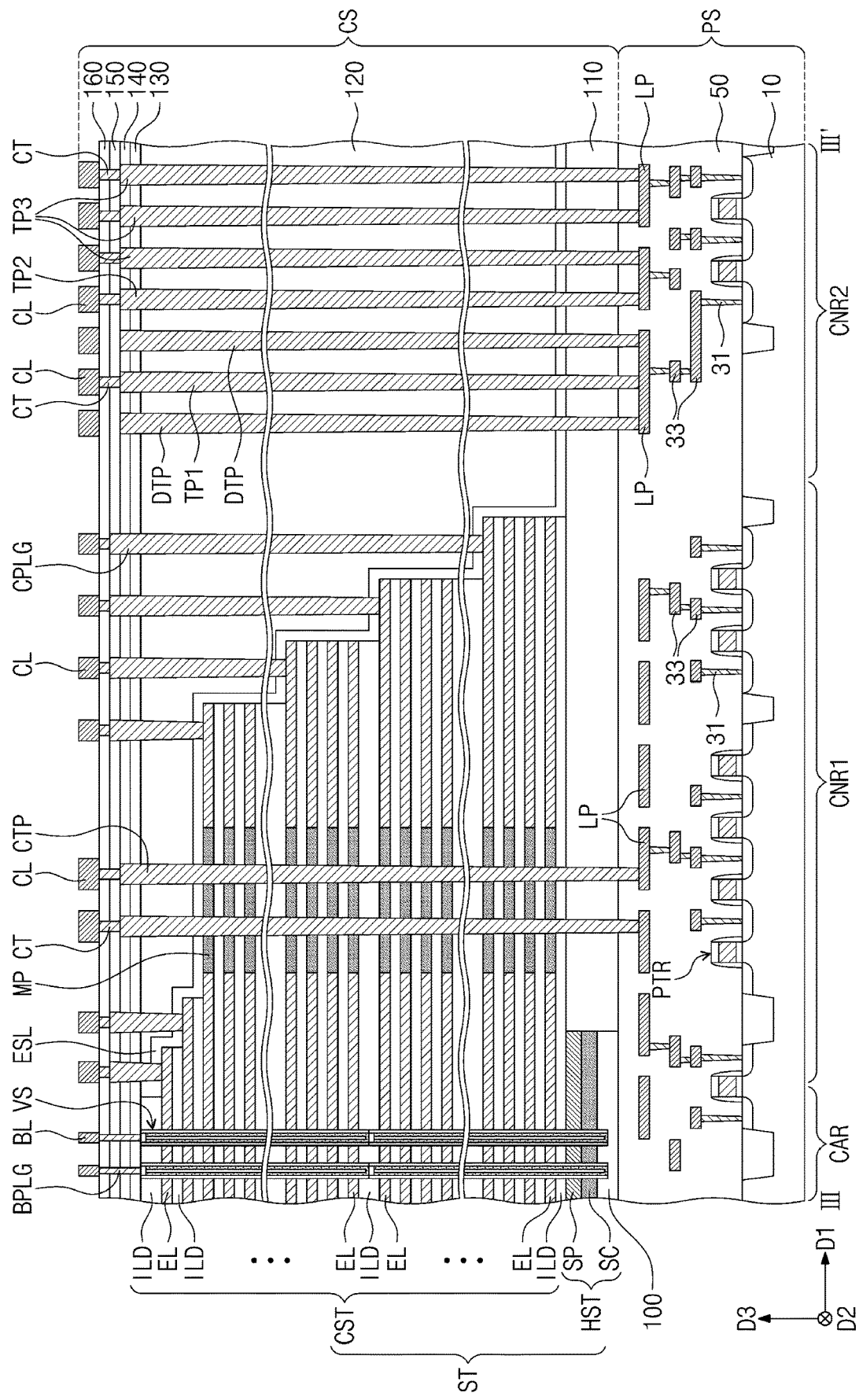
FIG. 7 illustrates a cross-sectional view along line of FIG. 6.

FIG. 6 illustrates a plan view of a three-dimensional semiconductor memory device according to some example embodiments. FIG. 7 illustrates a cross-sectional view taken along line of FIG. 6, and FIG. 8 illustrates a cross-sectional view taken along line of FIG. 6 in accordance with a modified embodiment.

Referring to FIGS. 6 and 7, on the second connection region CNR2, the first, second, and third peripheral through plugs TP1, TP2, and TP3 may be coupled to the landing pads LP of the peripheral circuit structure PS. The dummy through plugs DTP may be disposed around the first peripheral through plug TP1, and the first peripheral through plug TP1 may have a first upper width W1 substantially the same as a second upper width W2 of the dummy through plug DTP.

Similarly to the first peripheral through plug TP1, the dummy through plugs DTP may be coupled to the landing pad LP. For example, the dummy through plugs DTP may have their lengths in the third direction D3 substantially the same as that of the first peripheral through plug TP1.

Figure 8:
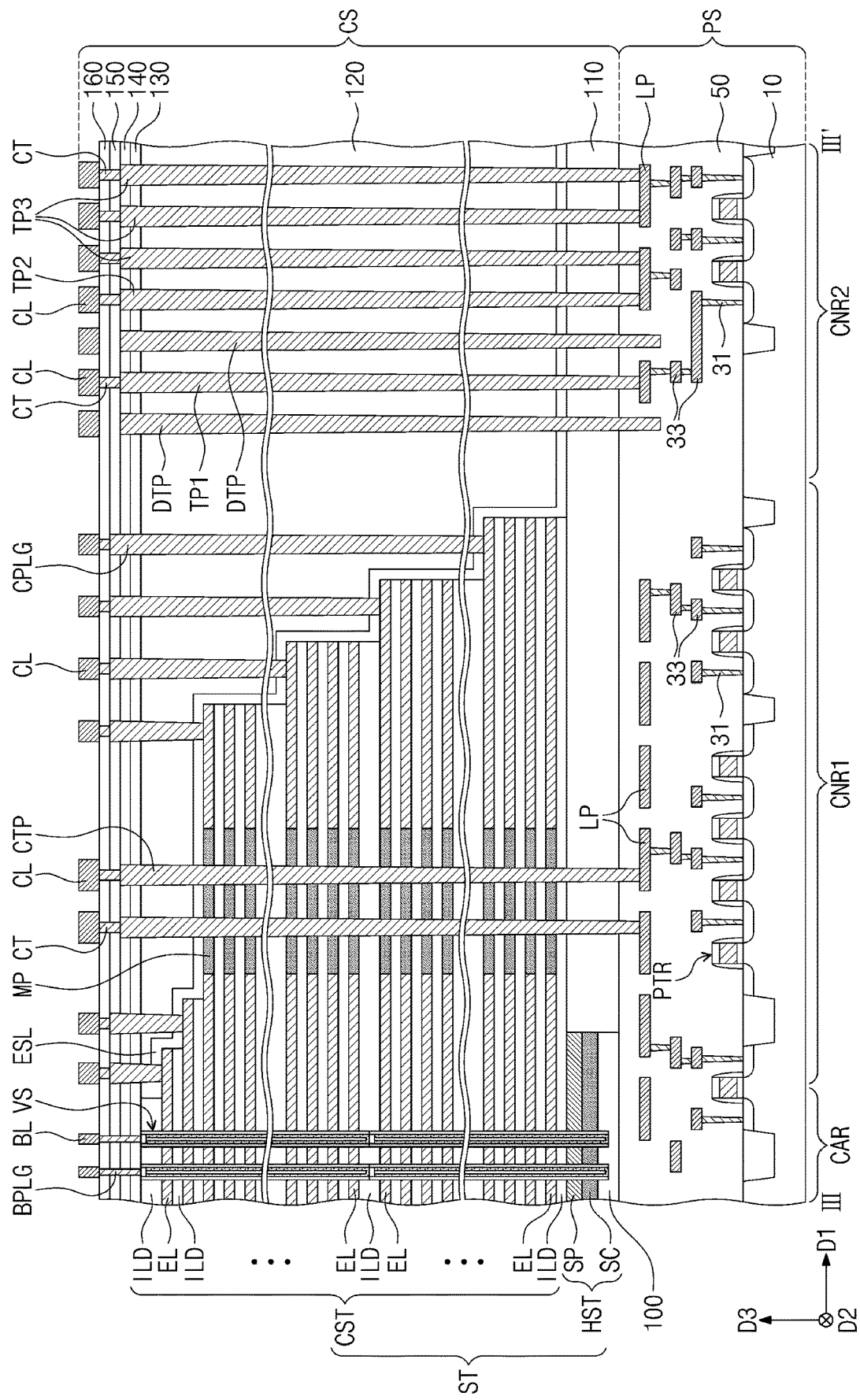
FIG. 8 illustrates a cross-sectional view along line of FIG. 6.

Referring to FIG. 8, the dummy through plugs DTP may have the same width as that of the first peripheral plug TP1 and may be spaced apart from the landing pad LP. In this case, the dummy through plugs DTP may have their bottom surfaces at a lower level than that of bottom surfaces of the landing pads LP. For example, the dummy through plugs DTP may have their lengths in the third direction D3 greater than that of the first peripheral through plug TP1.

None of the landing pads LP, the peripheral logic circuits PTR, and the peripheral circuit lines 33 may be disposed below, e.g., directly underneath, the dummy through plugs DTP. For example, when viewed in a plan view, the dummy through plugs DTP may not overlap the landing pads LP, the peripheral logic circuits PTR, or the peripheral circuit lines 33. Therefore, even when the dummy through plugs DTP have their long vertical lengths, the dummy through plugs DTP may be prevented from contacting the peripheral logic circuits PTR and the peripheral circuit lines 33.

Figure 9:
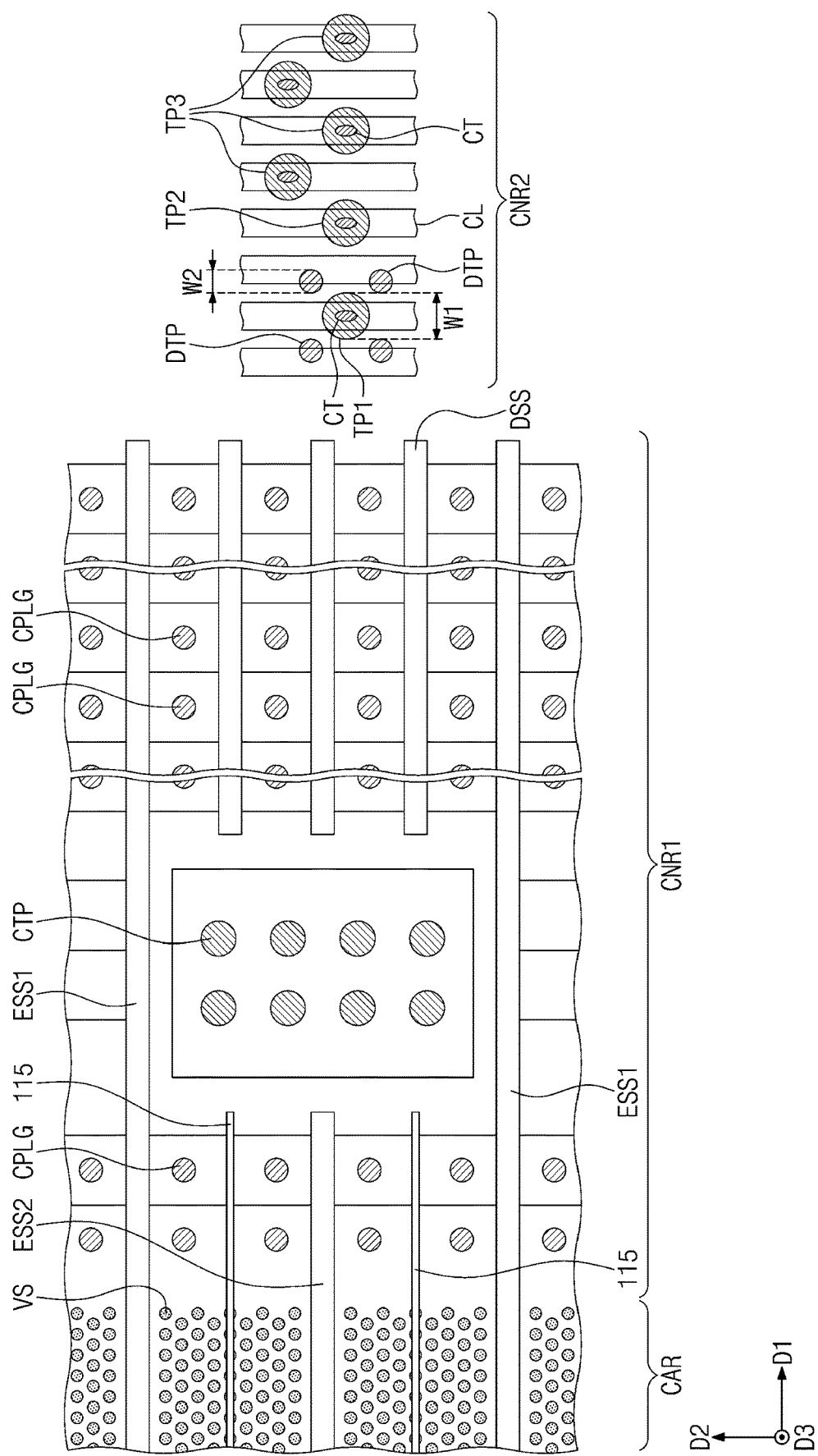
FIG. 9 illustrates a plan view of a three-dimensional semiconductor memory device according to some example embodiments.

FIG. 9 illustrates a plan view of a three-dimensional semiconductor memory device according to some example embodiments.

Referring to FIG. 9, the dummy through plugs DTP may be disposed around the first peripheral through plug TP1. The dummy through plugs DTP may be disposed around the first peripheral through plug TP1 in a diagonal direction relative to the first and second directions D1 and D2. The dummy through plugs DTP may have a second upper width W2 less than a first upper width W1 of the first peripheral through plug TP1.

The second and third peripheral through plugs TP2 and TP3 may be arranged in a zigzag fashion along the first direction D1 and may be correspondingly coupled through the contact plugs CT to the conductive lines CL.

Figure 10:
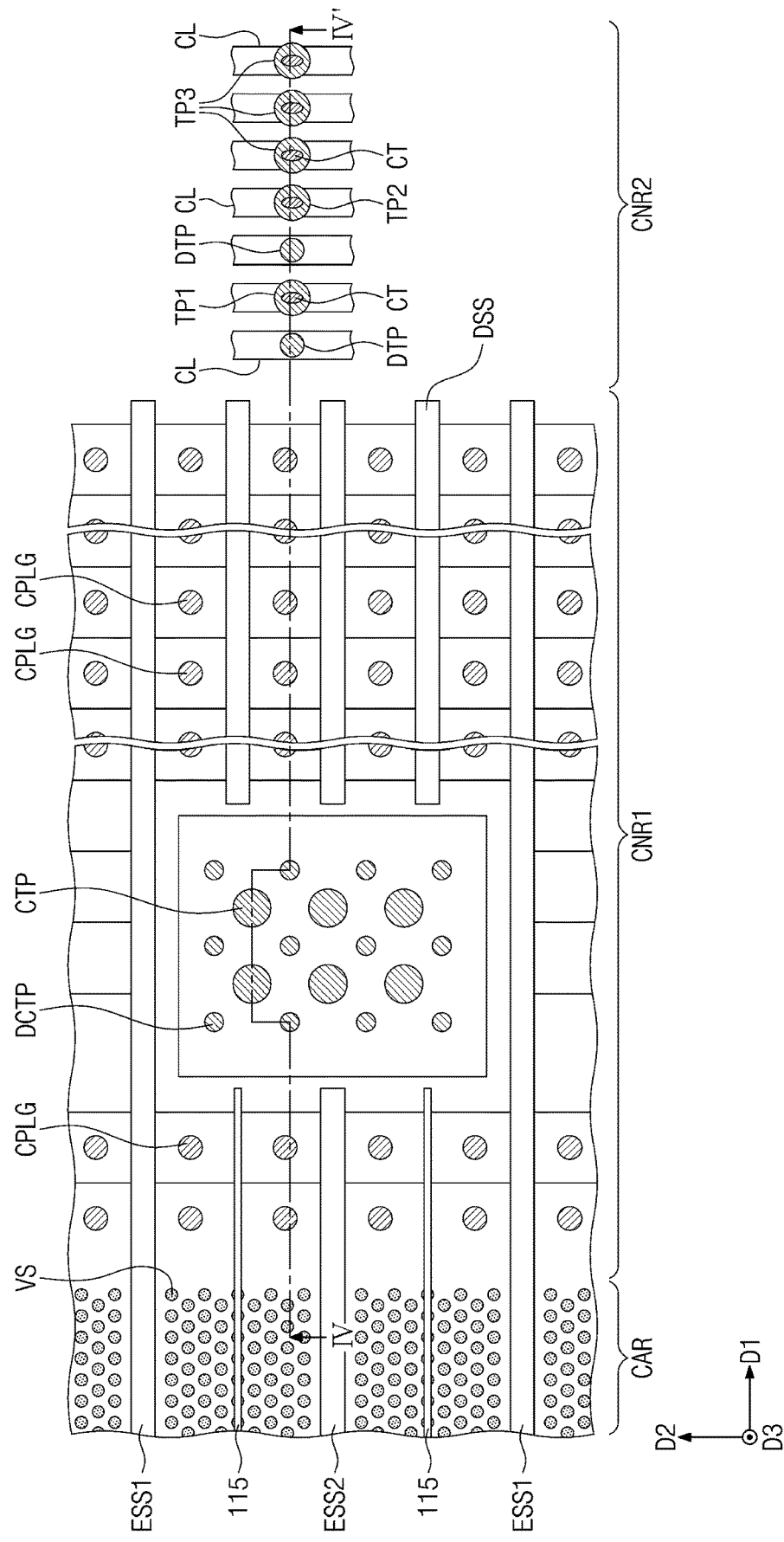
FIG. 10 illustrates a plan view of a three-dimensional semiconductor memory device according to some example embodiments.
Figure 11:
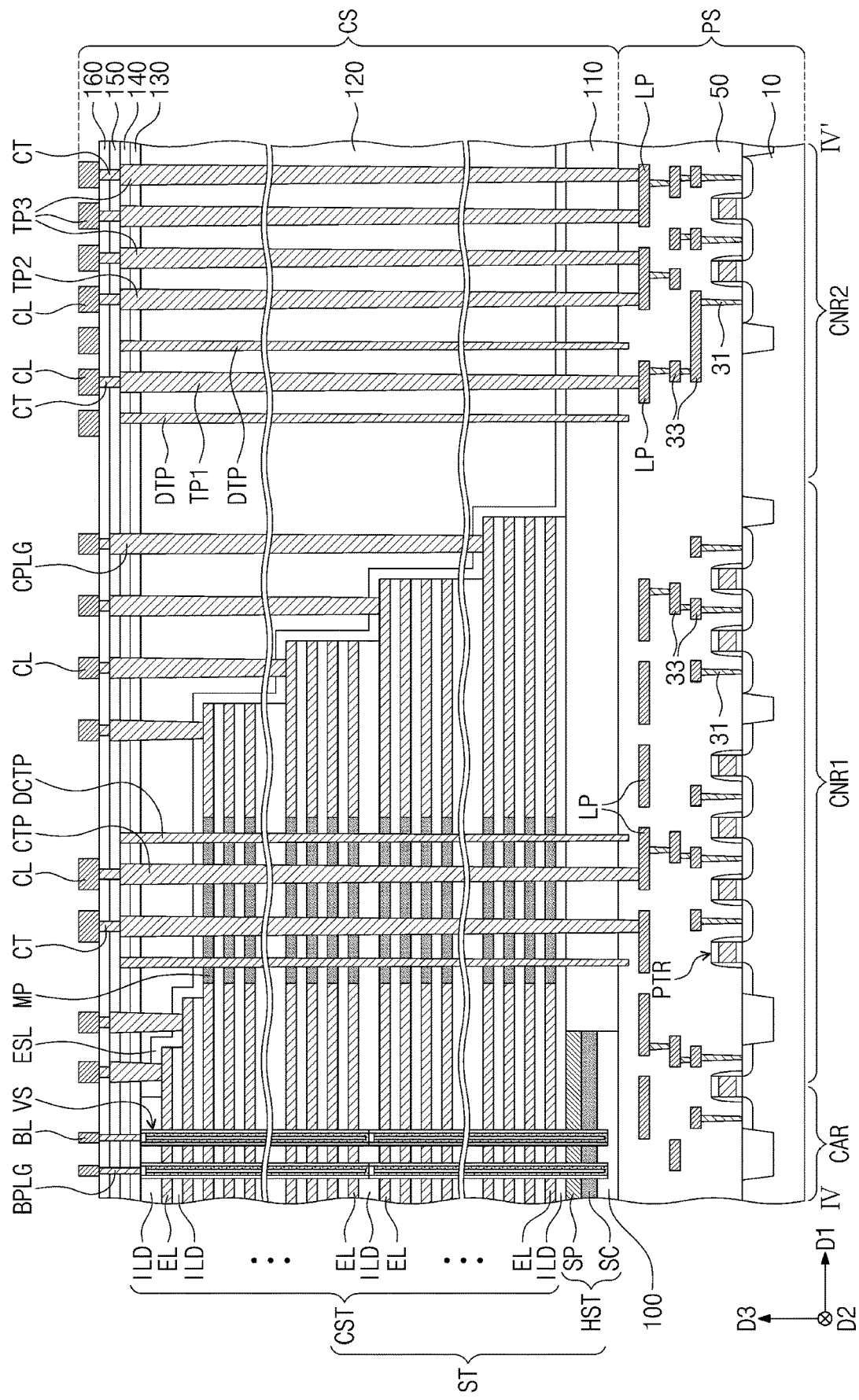
FIG. 11 illustrates a cross-sectional view along line IV-IV' of FIG. 10.

FIG. 10 illustrates a plan view of a three-dimensional semiconductor memory device according to some example embodiments. FIG. 11 illustrates a cross-sectional view taken along line IV-IV' of FIG. 10.

Referring to FIGS. 10 and 11, similar to the dummy through plugs DTP provided on the second connection region CNR2, dummy cell through plugs DCTP may be disposed on the first connection region CNR1 and around the cell through plugs CTP. The dummy cell through plugs DCTP may penetrate the mold patterns MP of the electrode structure ST.

The dummy cell through plugs DCTP may have their upper widths less than those of the cell through plugs CTP. The dummy cell through plugs DCTP may be vertically spaced apart from the landing pads LP. For example, the dummy cell through plugs DCTP may have their bottom surfaces in contact with the lower buried dielectric layer 50. The dummy cell through plugs DCTP may have their top surfaces at substantially the same level as that of top surfaces of the cell through plugs CTP. The dummy cell through plugs DCTP may be electrically separated from the conductive lines CL.

By way of summation and review, example embodiments provide a three-dimensional semiconductor memory device with increased reliability and improved electrical characteristics. That is, according to some example embodiments, on a region where peripheral through plugs are less densely packed, dummy through plugs may be formed around the peripheral through plug, and thus, it may be possible to reduce errors that no landing pad is exposed to a through hole for forming the peripheral through plug.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor memory device, comprising:
a peripheral circuit structure including:
peripheral circuits on a semiconductor substrate,
landing pads connected to the peripheral circuits, and
a lower dielectric layer that covers the peripheral circuits and the landing pads;
an electrode structure on the peripheral circuit structure, the electrode structure including vertically stacked electrodes;
a planarized dielectric layer that covers the electrode structure;
peripheral through plugs spaced apart from the electrode structure, the peripheral through plugs penetrating the planarized dielectric layer to connect to the landing pads;
conductive lines connected through contact plugs, respectively, to the peripheral through plugs; and
at least one dummy through plug adjacent to a first peripheral through plug of the peripheral through plugs, the at least one dummy through plug penetrating the planarized dielectric layer and extending into the lower dielectric layer, and the at least one dummy through plug being in direct contact with the lower dielectric layer and insulated from the conductive lines.

2. The device as claimed in claim 1, wherein the peripheral through plugs include:
a second peripheral through plug spaced apart at a first distance from the first peripheral through plug; and
a third peripheral through plug spaced apart at a second distance from the second peripheral through plug, the second distance being less than the first distance.

3. The device as claimed in claim 1, wherein each of the peripheral through plugs has a first upper width, and the at least one dummy through plug has a second upper width less than the first upper width.

4. The device as claimed in claim 3, wherein a bottom surface of the at least one dummy through plug is at a level higher than a level of a bottom surface of the first peripheral through plug.

5. The device as claimed in claim 1, wherein each of the peripheral through plugs has a first upper width, and the at least one dummy through plug has a second upper width that substantially equals the first upper width.

6. The device as claimed in claim 5, wherein the at least one dummy through plug is coupled to one of the landing pads.

7. The device as claimed in claim 1, wherein a bottom surface of the at least one dummy through plug is at a level different from a level of a bottom surface of the first peripheral through plug.

8. The device as claimed in claim 1, wherein:
a top surface of the at least one dummy through plug is at a same level as a level of a top surface of the first peripheral through plug, and
when viewed in a direction perpendicular to a top surface of the semiconductor substrate, a length of the at least one dummy through plug is different from a length of the first peripheral through plug.

9. The device as claimed in claim 1, wherein the at least one dummy through plug does not overlap the peripheral circuits.

10. The device as claimed in claim 1, wherein the at least one dummy through plug includes at least two dummy through plugs surrounding the first peripheral through plug.

11. The device as claimed in claim 1, further comprising:
a horizontal layer between the peripheral circuit structure and the electrode structure, the horizontal layer including a cell array region, a first connection region, and a second connection region; and
cell through plugs on the first connection region, the cell through plugs penetrating the electrode structure to connect to the peripheral circuit structure,
wherein the electrode structure has a stepwise structure on the first connection region.

12. The device as claimed in claim 11, wherein the electrode structure further includes mold patterns on the first connection region, the mold patterns being at same levels as levels of the electrodes, and the cell through plugs penetrating the mold patterns.

13. A three-dimensional semiconductor memory device, comprising:
a peripheral circuit structure including:
peripheral circuits on a semiconductor substrate, and
landing pads connected to the peripheral circuits;
a horizontal layer on the peripheral circuit structure, the horizontal layer including a cell array region, a first connection region, and a second connection region;
an electrode structure on the cell array region and the first connection region, the electrode structure including electrodes vertically stacked with a stepwise structure on the first connection region;
a planarized dielectric layer covering the electrode structure;
peripheral through plugs on the second connection region, the peripheral through plugs penetrating the planarized dielectric layer to connect to the landing pads, and the peripheral though plugs including:
a first peripheral through plug,
a second peripheral through plug spaced apart at a first distance from the first peripheral through plug,
a third peripheral through plug spaced apart at a second distance from the second peripheral through plug, the second distance being less than the first distance, and
at least one dummy through plug adjacent to the first peripheral through plug, the at least one dummy through plug penetrating the planarized dielectric layer,
wherein each of the first, second, and third peripheral through plugs has a first upper width,
wherein the at least one dummy through plug has a second upper width less than the first upper width, and
wherein a bottom surface of the at least one dummy through plug is in direct contact with a dielectric layer that covers the peripheral circuits and the landing pads.

14. The device as claimed in claim 13, further comprising:
an interlayer dielectric layer on the planarized dielectric layer; and
conductive lines on the interlayer dielectric layer, the conductive lines being correspondingly connected through contact plugs to the first, second, and third peripheral through plugs,
wherein the at least one dummy through plug is insulated from the conductive lines.

15. The device as claimed in claim 13, wherein a bottom surface of the at least one dummy through plug is at a level different from a level of a bottom surface of the first peripheral through plug.

16. The device as claimed in claim 13, wherein:
a top surface of the at least one dummy through plug is at a same level as a level of a top surface of the first peripheral through plug, and
when viewed in a direction perpendicular to a top surface of the semiconductor substrate, a length of the at least one dummy through plug is different from a length of the first peripheral through plug.

17. A three-dimensional semiconductor memory device, comprising:
a peripheral circuit structure including:
peripheral circuits on a semiconductor substrate,
landing pads connected to the peripheral circuits, and
a dielectric layer that covers the peripheral circuits and the landing pads;
a horizontal layer on the dielectric layer of the peripheral circuit structure, the horizontal layer including a cell array region, a first connection region, and a second connection region;
an electrode structure on the cell array region and the first connection region, the electrode structure including electrodes vertically stacked with a stepwise structure on the first connection region;
a planarized dielectric layer covering the electrode structure;
vertical channel structures on the cell array region, the vertical channel structures penetrating the electrode structure;
a cell through plug on the first connection region and coupled to a first landing pad of the landing pads, the cell through plug penetrating the electrode structure;
a first peripheral through plug on the second connection region and coupled to a second landing pad of the landing pads;
a second peripheral through plug spaced apart at a first distance from the first peripheral through plug;
a third peripheral through plug spaced apart at a second distance from the second peripheral through plug, the second distance being less than the first distance;
at least one dummy through plug adjacent to the first peripheral through plug, the at least one dummy through plug penetrating the planarized dielectric layer, and a bottom surface of the at least one dummy through plug being in direct contact with the dielectric layer of the peripheral circuit structure;
an interlayer dielectric layer on the planarized dielectric layer; and
conductive lines on the interlayer dielectric layer, the conductive lines being correspondingly connected through contact plugs to the first, second, and third peripheral through plugs,
wherein each of the first, second, and third peripheral through plugs has a first upper width, and
wherein the dummy through plug has a second upper width less than the first upper width.

18. The device as claimed in claim 17, wherein:
a top surface of the at least one dummy through plug is at a same level as a level of top surfaces of the first, second, and third peripheral through plugs, and
when viewed in a direction perpendicular to a top surface of the semiconductor substrate, a length of the at least one dummy through plug is different from a length of the first peripheral through plug.

* * * * *